United States Patent
Sloggett et al.

Patent Number: 5,635,834
Date of Patent: Jun. 3, 1997

[54] SQUID DETECTOR WITH FLUX FEEDBACK COIL SIZED AND LOCATED TO PRODUCE UNIFORM FEEDBACK FLUX

[75] Inventors: Graeme J. Sloggett, Haberfield; David L. Dart, Eleebana, both of Australia

[73] Assignees: The Broken Hill Proprietary Company Limited, Melbourne; Commonwealth Scientific and Industrial Research Organisation, Campbell, both of Australia

[21] Appl. No.: 305,329

[22] Filed: Sep. 15, 1994

[30] Foreign Application Priority Data

Sep. 15, 1993 [AU] Australia .................. PM1247

[51] Int. Cl.⁶ .................................. G01R 33/035
[52] U.S. Cl. .................... 324/248; 505/846; 327/527
[58] Field of Search ................ 324/248, 244, 324/260, 262; 505/844–846, 160, 162, 190, 702; 327/527

[56] References Cited

U.S. PATENT DOCUMENTS

| 4,004,217 | 1/1977 | Giffard | 324/248 |
| 4,389,612 | 6/1983 | Simmonds et al. | 324/248 |
| 4,663,590 | 5/1987 | Gershenson et al. | 324/248 |
| 4,801,882 | 1/1989 | Daalmans | 324/248 |
| 4,827,217 | 5/1989 | Paulson | 324/248 |
| 4,851,776 | 7/1989 | Goto et al. | 324/248 |
| 4,906,607 | 3/1990 | Dev Tyagi | 324/248 |
| 4,987,368 | 1/1991 | Vinegar | 324/303 |
| 5,012,190 | 4/1991 | Dössel | 324/248 |
| 5,218,297 | 6/1993 | Nakane et al. | 324/248 |
| 5,319,307 | 6/1994 | Simmonds | 324/248 |
| 5,326,986 | 7/1994 | Miller, Jr. et al. | 505/162 |
| 5,352,978 | 10/1994 | Nojima et al. | 324/248 |
| 5,367,259 | 11/1994 | Matsumoto et al. | 324/248 |
| 5,387,864 | 2/1995 | Gershenson et al. | 324/248 |

FOREIGN PATENT DOCUMENTS

| 4-332886 | 11/1992 | Japan | 324/248 |

Primary Examiner—Sandra L. O'Shea
Assistant Examiner—Jay M. Patidar
Attorney, Agent, or Firm—Nixon & Vanderhye P.C.

[57] ABSTRACT

A high temperature $T_c$ SQUID chip magnetometer has a flux-locked loop circuit including an independent feedback coil having an internal diameter greater than the maximum SQUID chip dimension. The feedback coil is mounted in close co-axial proximity to the SQUID chip to produce a substantially uniform feedback field over the entire area of the SQUID chip to cancel applied fields which penetrate the superconducting material.

43 Claims, 8 Drawing Sheets

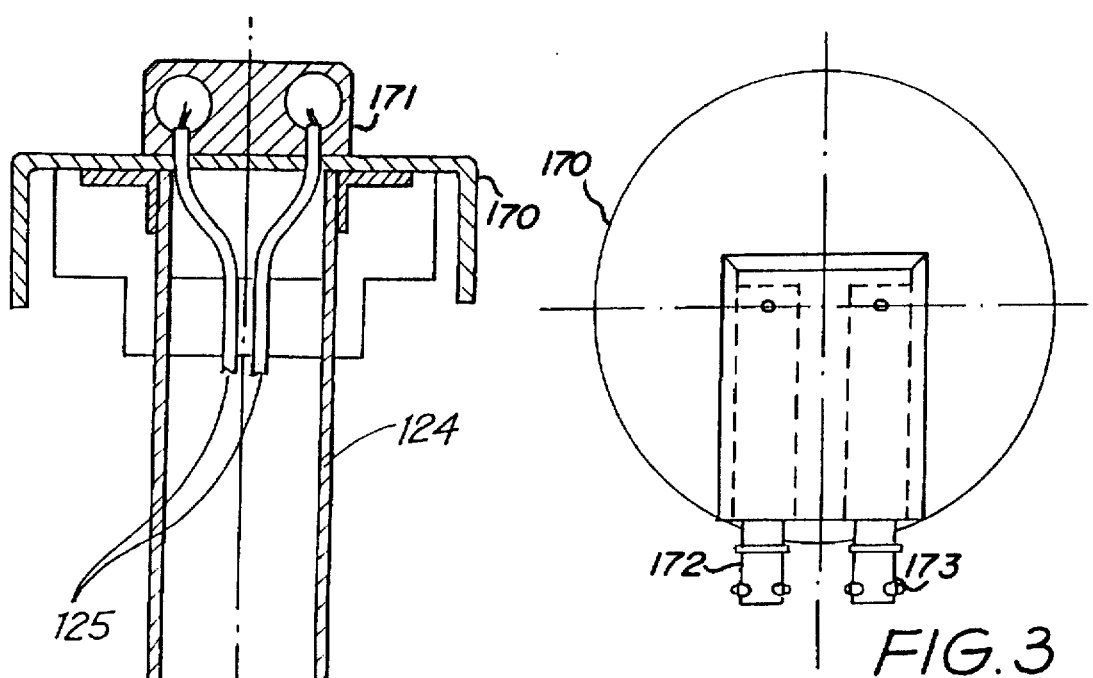
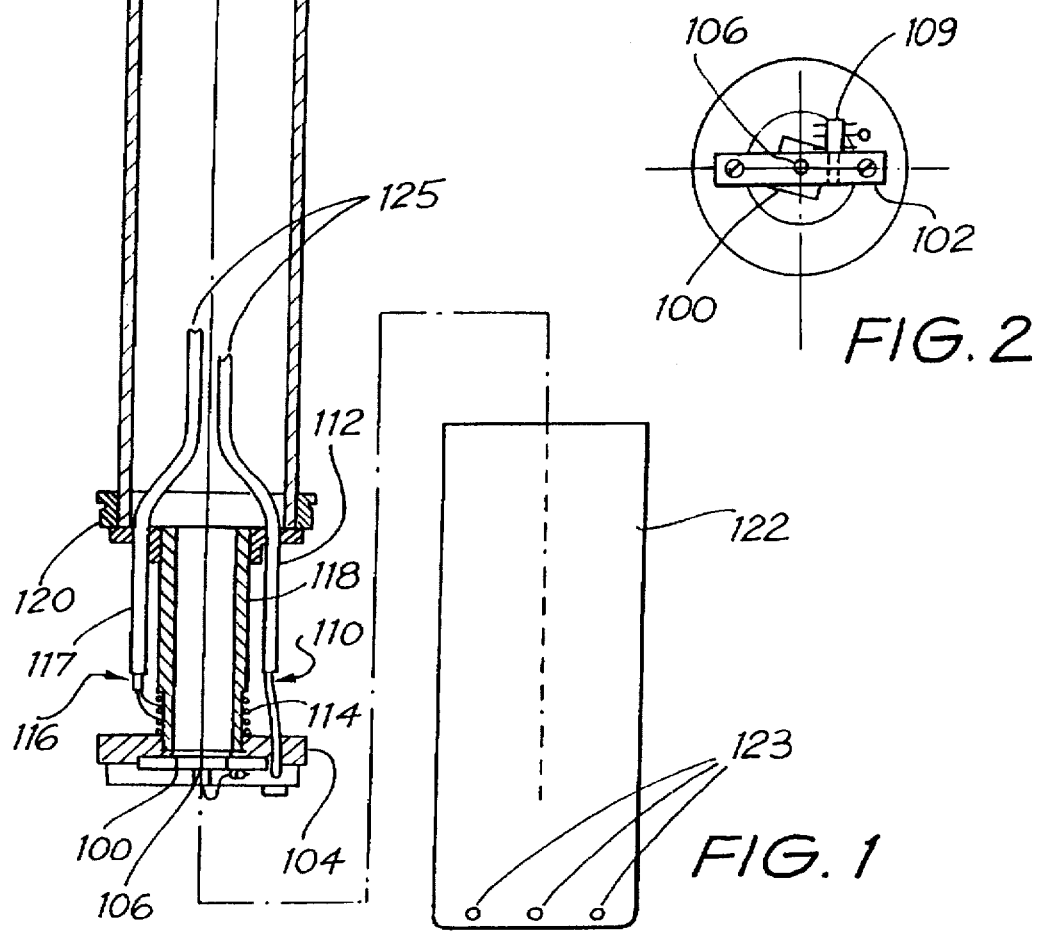
FIG. 3
FIG. 2
FIG. 1

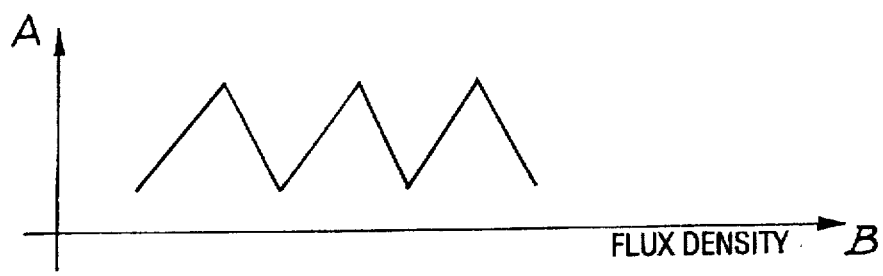
FIG. 7a
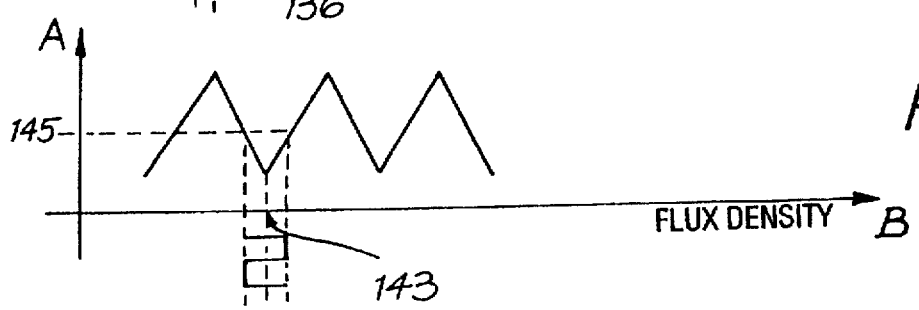
FIG. 7b
FIG. 7c
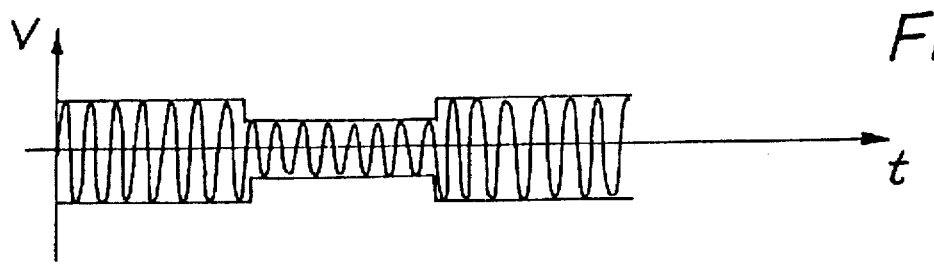
FIG. 8a
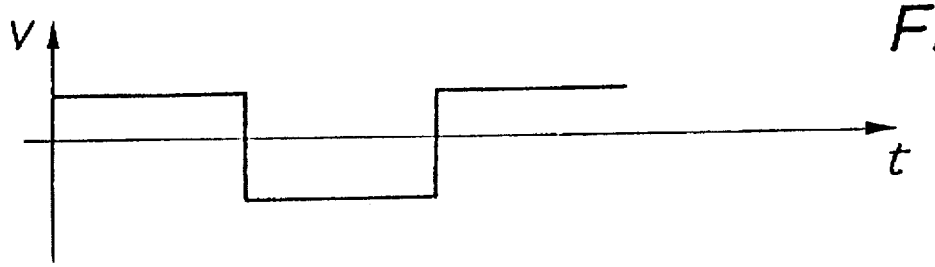
FIG. 8b

SQUID DETECTOR WITH FLUX FEEDBACK COIL SIZED AND LOCATED TO PRODUCE UNIFORM FEEDBACK FLUX

FIELD OF THE INVENTION

The present invention relates to magnetometer systems and, in particular, to a high critical temperature superconducting quantum interference device (SQUID) magnetometer for use in transient electromagnetic mineral prospecting and other types of electromagnetic prospecting systems, nuclear magnetic resonance detectors and non-destructive testing applications, among others. However, the invention will be described in the context of transient electromagnetic mineral prospecting.

BACKGROUND OF THE INVENTION

Transient electromagnetic (TEM) mineral prospecting commonly employs magnetic field gradient detectors (dB/dt detectors such as induction coils. However, it is known that detectors which measure absolute magnetic field intensity (B-field detectors) provide more accurate responses from deep mineral bodies than responses provided by magnetic field gradient detectors. It is also known that B-field detectors provide superior performance to dB/dt detectors in the presence of a conducting overburden, and such conducting overburdens are characteristic of much of the terrain in Australia and elsewhere. Thus, it is advantageous to use B-field detectors in TEM mineral prospecting.

A TEM prospecting system detects the presence of ore bodies by virtue of their higher conductivity than the surrounding ground. Thus, TEM systems also respond to conducting materials such as metals in the system itself, giving rise to a so-called "self response". Thus, to minimise the effects of the self response, TEM magnetometers should preferably contain a minimum amount of metal.

Vibration can be a serious cause of noise in magnetic detectors operating in the Earth's magnetic field. For example, an angular vibration of amplitude $10^{-6}$ radians can cause fluctuations of 50 pT in the geomagnetic field component measured by the detector. Such fluctuations are much larger than the minimum TEM magnetic field to be measured. Thus, TEM magnetometers should preferably be immunised against vibration.

SQUID action can be destroyed by radio frequency (rf) interference from, for example, radio and television transmitters. SQUIDs must, therefore, preferably be shielded against such interference by full of partial enclosure in conducting containers.

Radio frequency SQUIDs are usually magnetically coupled to associated electronics. The magnetic coupling serves two purposes: Firstly, the SQUID must be coupled to an rf tuned circuit to obtain flux bias, and to enable readout of the SQUID; and conventionally, this magnetic coupling is provided by a small rf coil in close proximity to the SQUID. Secondly, SQUIDs are normally operated in a feedback mode called a flux-locked loop which provides an output voltage proportional to an applied or detected flux over a wide dynamic range. Conventionally, current is fed back to the rf coil to cancel the applied or detected flux. High-$T_C$ materials are characteristically hysteretic in their response to sufficiently large magnetic fields. This is particularly true of the devices incorporating Josephson junctions or weak links, such as SQUIDs. It has been found that the use of the rf coil for flux feedback produces a hysteretie response and hence unacceptable operation with signals having a large dynamic range.

various B-field detectors exist, but they usually fail to meet at least one of the following requirements of a TEM detector: high sensitivity; high bandwidth; high dynamic range; high slew rate; insensitivity to large dc magnetic fields; minimal use of metallic components; small size and low weight; and low cost.

Liquid helium-cooled superconducting quantum interference device (SQUID) magnetometer systems are B-field detectors which can satisfy most of the requirements listed above. However, the cost and the difficulty in obtaining, storing, and transporting liquid helium to remote locations makes such liquid-helium cooled SQUID magnetemptor systems impractical for mineral prospecting. A further disadvantage of such systems is that they are bulky and heavy. This makes them difficult to handle and transport, and difficult to use in confined spaces, such as airborne systems, or remote locations.

Thus, SQUID magnetometers which can operate at higher temperatures than that of liquid helium (i.e., high-$T_C$ SQUID magnetometers) are desirable. Unfortunately, high-$T_C$ SQUIDs do not usually have characteristics which are as close to the ideal as the characteristics of conventional SQUIDs. One of the main reasons for this is that magnetic fields usually penetrate high-$T_C$ superconductors to a greater extent than they penetrate low-$T_c$ SQUIDs. The inferior performance of high-$T_C$ SQUIDs caused prior art flux-locked loop feedback circuits in magnetometers to operate unsatisfactorily.

The rf coil used with rf SQUIDs is small and therefore produces a magnetic field which is non-uniform over the area of the SQUID. Thus, when the flux-locked loop operates, it produces a feedback field which cancels the applied field in some areas of the SQUID but not all. The areas where the applied field is not fully cancelled experience a varying magnetic field when the applied field varies. If the applied field has a wide dynamic range, this can lead to hysteretic behaviour in parts of the SQUID, and hence in the SQUID as a whole.

The coil used for feedback to a dc SQUID may similarly produce a non-uniform field and lead to hysteretic SQUID response.

SUMMARY OF THE INVENTION

The present invention can improve the performance of high-$T_C$ SQUIDs by helping to provide a substantially uniform feedback magnetic field over the entire SQUID chip. This is accomplished with the use of a relatively large coil positioned near the superconductor, and by exciting the coil with a signal fed back around a flux-locked loop.

The present invention consists in a high critical temperature (high-$T_C$), superconducting quantum interference device (SQUID) magnetometer for measuring an applied magnetic field, the magnetometer including a SQUID chip threaded by an applied flux produced by the applied magnetic field, the magnetometer characterised in that a separate feedback coil is positioned adjacent the SQUID chip, and a flux-locked loop produces a signal to energise the feedback coil, the flux-locked loop being driven such that the feedback coil produces a feedback magnetic flux which adds to, or subtracts from, the applied magnetic flux to produce a resultant flux component threading the SQUID chip, the feedback coil having a size relative to the SQUID chip to cause the resultant flux component to be substantially uniform over the SQUID chip, the signal thereby being indicative of the applied magnetic flux.

Preferably, the feedback coil is a cylindrical (i.e., solenoidal) coil mounted co-axially with and in close proximity to the SQUID chip. The cylindrical coil is also preferably larger in diameter than the maximum dimension Of the SQUID chip.

The magnetometer of the present invention may be configured to use either an rf SQUID or a dc SQUID. In the case of an rf SQUID magnetometer the SQUID chip will be configured with a single weak link, whereas in the case of a dc SQUID magnetometer, the SQUID chip wall be configured with two weak links.

In the preferred embodiment, the SQUID chip is formed as a thin film of ceramic superconducting material on a suitable substrate. The substrate in the preferred embodiment is magnesium oxide single crystal material although, it will be recognised that a variety of suitable materials exist.

In the preferred embodiment the superconducting material is $YBa_2Cu_3O_7$ and the weak link, or each weak link is formed by providing a small step in the substrate to cause a misalignment of the crystals of the superconducting material in the region of the step. In other embodiments the weak link might also be formed as a grain boundary junction, a bicrystal junction, a biepitaxial junction, a step-SNS junction, a multi-layer junction, a ramp junction, or by any other technique suitable for the superconducting material being used.

In the rf SQUID embodiment, the SQUID chip is excited by an rf constant current source which is coupled to the SQUID chip by an rf coil. Preferably the rf coil is part of a tuned circuit tuned to the frequency of the constant current source. The rf coil is preferably a flat spiral coil mounted co-axially with and parallel to the SQUID chip. The rf constant current source will typically operate in the frequency range of 1 MHz to microwave frequencies, but in the preferred embodiment it operates in the range of 150–200 MHz.

In the dc SQUID embodiment, the SQUID chip is excited by a dc constant current source.

In one embodiment of the rf SQUID magnetometer, the rf sense coil and the separate feedback coil are each connected to the flux-locked loop via a single cable, the signals to the two coils being separated by a cross-over network. Preferably, the cross-over network is a simple LC network, however depending upon the operating frequencies of the flux-locked loop more elaborate cross-overs may be necessary.

BRIEF DESCRIPTION OF THE DRAWINGS

The invention will be described with reference to the accompanying figures in which:

FIG. 1 is a longitudinal section of a preferred embodiment of an assembly for a SQUID magnetometer in accordance with the present invention;

FIG. 2 is a plan view from below of a sub-assembly for use in the assembly of FIG. 1;

FIG. 3 is a plan view from above of the assembly of FIG. 1;

FIGS. 7a, 7b, 7c, 8a, and 8b are graphs showing typical relationships and representative voltage waveforms of the schematic block diagram of FIG. 6;

DETAILED DESCRIPTION OF THE PREFERRED EMBODIMENT

Transient electromagnetic mineral prospecting QE an area of ground of interest involves subjecting the ground to a large pulsating magnetic field. Typically, this field is produced by passing square bipolar current pulses through a coil. This coil is often pegged out on the ground, but can be aircraft mounted for airborne TEM. Typically, the coil has an area of the order of 2,500 $m^2$ to 500,000 $m^2$ for ground based measurements, but, in the case of airborne TEM, is limited by the maximum dimensions of the aircraft. Typically, the waveform of the bipolar current is periodic with a period of 10 milliseconds to 500 milliseconds. Byway of example, one possible such waveform which has been used successfully has a period of approximately two hundred milliseconds and comprises a fifty millisecond interval in which a first current of ten amps flows, a fifty millisecond interval in which no current flows, a fifty millisecond interval in which a ten amp current flows in the opposite direction to the first current, and a further fifty millisecond period in which no current flows. During the intervals in which current flows, the ground is magnetised by the resulting magnetic field. During the intervals in which no current flows, the ground maintains a residual magnetism, and the decay of the residual magnetism is related to the electrical conductivity of the ground.

The SQUID magnetometer is required to measure properties of the decay of the residual magnetism. This residual magnetism constitutes small signals interspersed between large pulses in a primary magnetic field. The SQUID magnetometer must be capable of maintaining lock (i.e., measuring the primary field) as well as measuring properties of the decay of the residual magnetism. This requires the magnetometer system to have a wide dynamic range, a wide bandwidth, and a high slew rate.

Figure 4A:
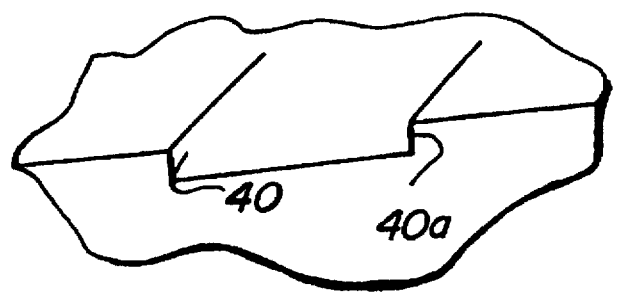
FIG. 4A is a schematic depiction of one or more steps in the substrate of SQUID chip 100.
Figure 4:
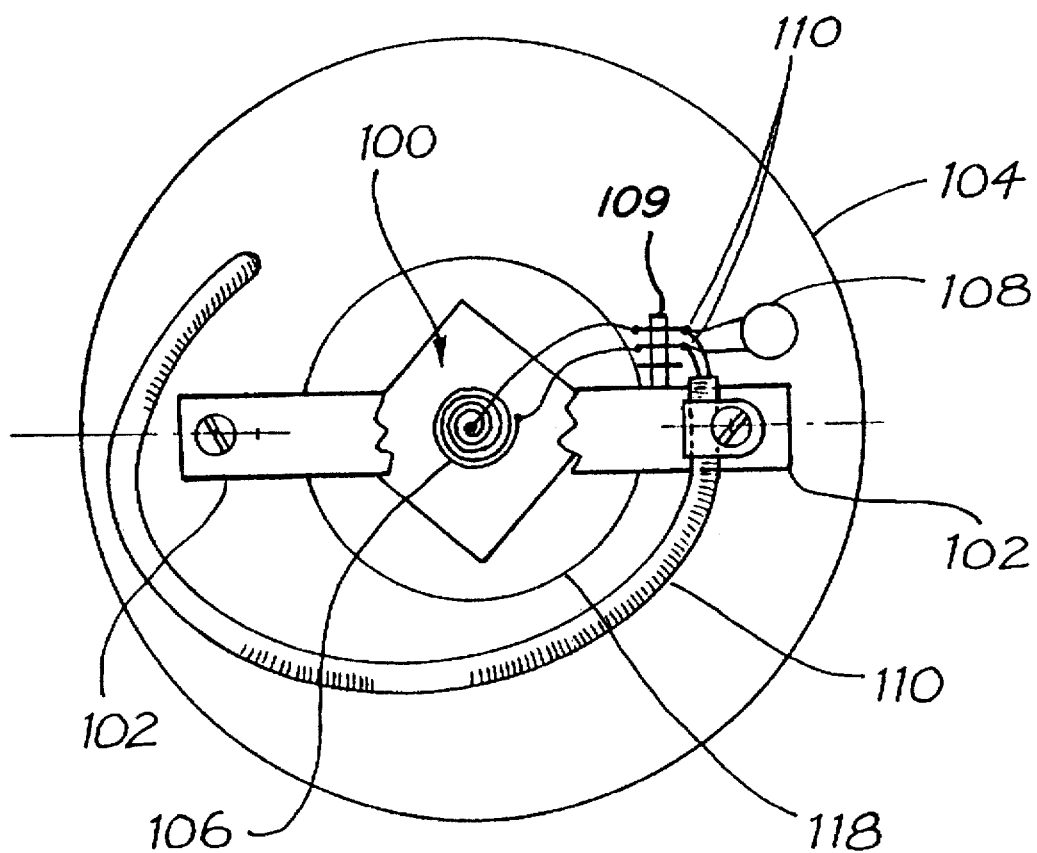
FIG. 4 is a partially cut-away enlarged view of the sub-assembly of FIG. 2.
Figure 5A:
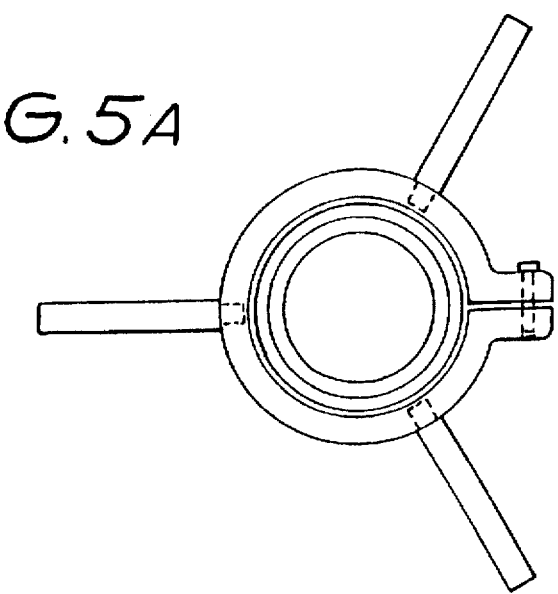
FIG. 5A and 5B are respectively a top plain view and a longitudinal cross-section of a dewar for use with the assembly of FIG. 2.
Figure 5B:
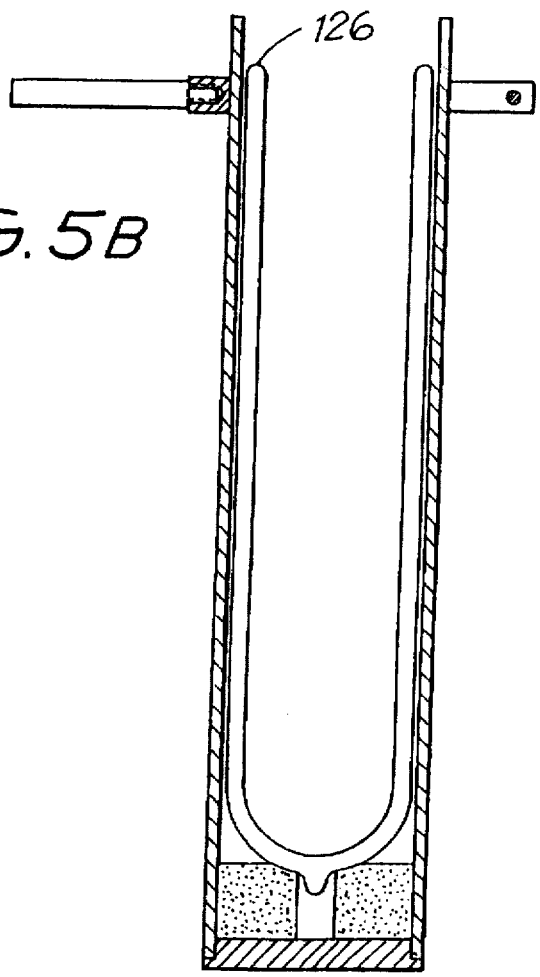

Referring to FIGS. 1 to 5B, which illustrate a probe assembly for the preferred embodiment of the present invention, a high-$T_C$ SQUID chip 100 is held by clamp 102 on base 104. SQUID chip 100 is formed as a thin film of ceramic superconducting material, preferably $YBa_2Cu_3O_7$ (YBCO), on a suitable substrate, and a weak link is formed, for example, by providing a step 40C or steps 40, 40a as depicted in FIG. 4A) in the substrate to cause a misalignment of the crystals of the superconducting material in the region of the step.

As shown in FIGS. 1 to 5, the use of high-$T_C$ superconductors to produce a magnetometer having magnetic and electrical characteristics suitable for TEM mineral prospecting advantageously enables the SQUID chip to be housed in a small dewar which holds approximately 0.5 liters of liquid nitrogen. Such a container enables hold times of 3 to 24 hours, depending on operating conditions. The dewar may be constructed from materials such as evacuated polystyrene, or other materials. Advantageously, liquid nitrogen is inexpensive, widely available, readily transported over long distances, and easily stored and transferred.

The magnetometer of the present invention is generally less bulky than previous low-$T_c$ SQUID magnetometers because of the simple cooling requirements. Typically, the present magnetometer has an external diameter of 100 mm and a length of 400 mm, excluding the electronics. The weight of the magnetometer is approximately 1–5 kg when it is fully charged with liquid nitrogen. Thus, the magnetometer is compact and easily portable.

The small size of the dewar enables it to be inserted into a small hole in the ground, thereby minimising the effects of vibration. In addition, the SQUID chip is mounted on a probe which is attached to the dewar only at the top, and the probe is sufficiently rigid to minimiss vibration modes. The probe top is designed to avoid coupling vibration from the electrical cables to the SQUID chip.

The SQUID and all electrical components and leads are fully shielded. A thin-walled, non-magnetic stainless steel shield having a thickness of in the range of 0.1 mm to 0.5 mm has been found to give acceptable shielding with minimal response.

In the preferred embodiment, the end of the probe tip containing the SQUID chip 100 and associated coils is contained in a cylindrical can 122 and cap 120 formed of thin, non-magnetic stainless steel having a wall thickness of 0.3 mm. Cables 125 leading from the head 170 of the probe (refer to FIGS. 1 and 3) to tip are also shielded in thin walled stainless steel tube. In the head 170 of the probe the cables enter a connector block 171 in which are mounted bayonet connectors 172, 173 to connect the cables 125 to field cables (not shown) running back to the flux locked loop electronics (refer to FIG. 6).

As in conventional rf SQUID magnetometers, SQUID chip 100 is excited by spiral (pancake) radio-frequency (rf) coil ($L_{RF}$) 106, and that coil is connected in parallel with capacitor ($C_{RF}$) 108 (mounted on terminal block 109 and not shown in FIG. 1) to form a tuned circuit. Co-axial cable 110 connects the tuned circuit to a flux-locked loop which is described below, the co-axial cable being enclosed in a further outer shield 112.

Feedback coil 114 is positioned adjacent to the SQUID chip 100, substantially co-axially with rf coil 106, is energised by feedback co-axial cable 116, and has a size relative to the SQUID chip such that a resultant magnetic flux can be established which is substantially uniform over the SQUID chip. The feedback co-axial cable 116 is enclosed in a further outer shield 117. Feedback coil 114 is wound around tubular former 118, and base 104 holding SQUID chip 100, rf coil 106, and capacitor 108 is mounted on an end of tubular former 118. These components form a sub-assembly which is mounted on rf shield top cap 120, and the sub-assembly is inserted into rf shield 122 so that rf shield top cap 120 contacts rf shield 122 to form a shielded enclosure, thereby isolating the SQUID chip and its associated tuned circuit and feedback coil from external rf fields. The sub-assembly is mounted on extension tube 124 and placed within dewar 126 which is filled with liquid nitrogen, thereby maintaining all components of the sub-assembly at an appropriate cryogenic temperature. Several holes 123 of approximately 1 mm in diameter are provided in shield 122 to allow filling and draining of the shield with liquid nitrogen.

Figure 6:
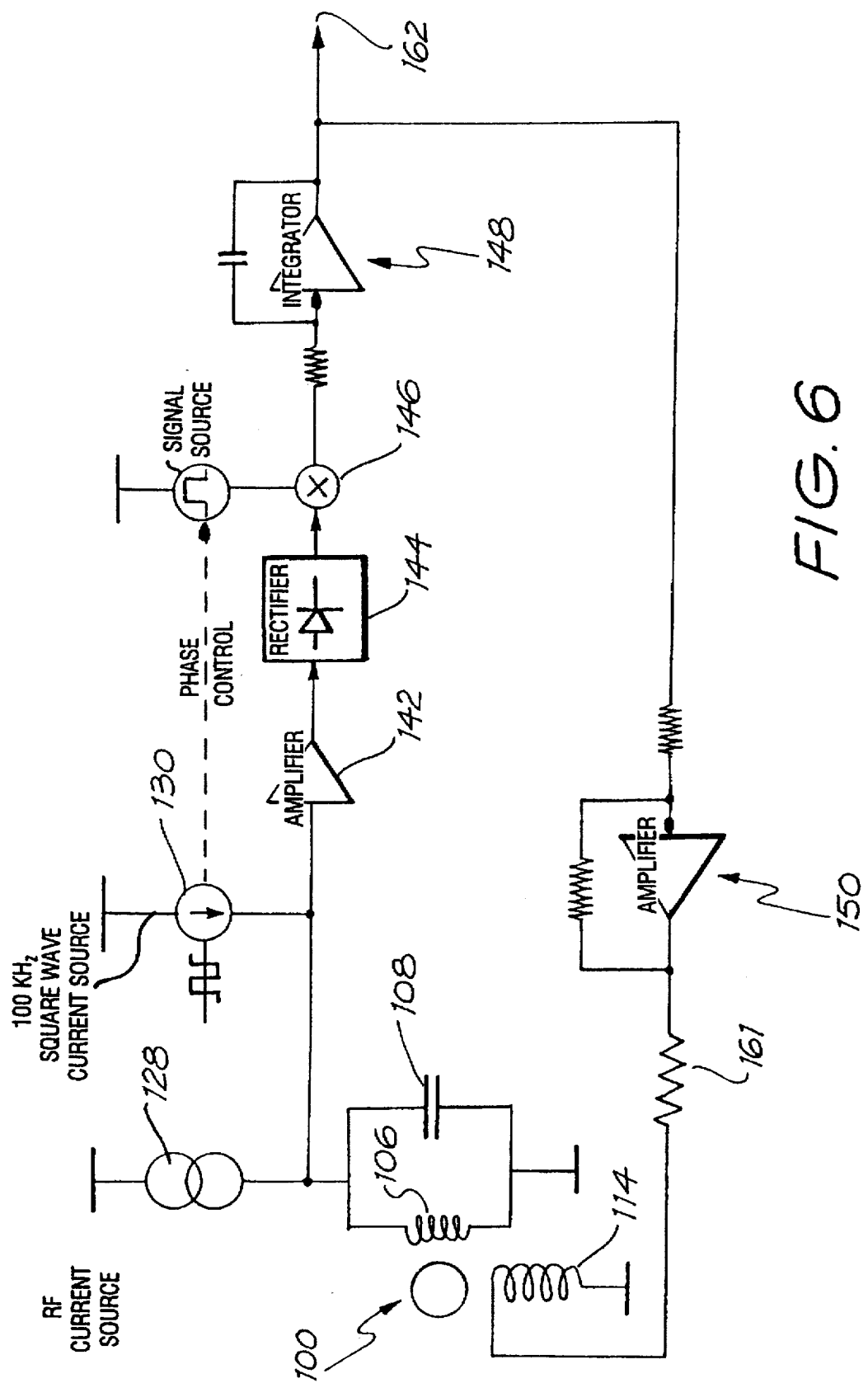
FIG. 6 is a schematic block diagram of a flux-locked loop for use with a preferred embodiment of the SQUID magnetometer of the present invention.

FIG. 6 illustrates a schematic block diagram of a flux-locked loop suitable for operating the high-$T_C$ rf SQUID with the additional feedback coil. Radio frequency current source 128 provides a sinusoidal current to drive the tuned circuit comprising rf coil 106 in parallel with capacitor 108. Typically, the rf current has a frequency ranging from 1 MHz to microwave frequencies, but preferably the frequency is in the range of 150 MHz to 200 MHz. The field from rf coil 106 is coupled to high-$T_C$ SQUID chip 100, and the amplitude of the rf voltage generated across the tuned circuit is affected by the magnetic flux in the SQUID chip.

FIG. 7a is a graph which illustrates the variation of the amplitude of the rf voltage across the tuned circuit as a function of the magnetic flux in the SQUID chip. The amplitude is substantially a periodic, triangular-wave function of the magnetic flux.

Current source 130 superimposes a square-wave onto the sinusoidal current from source 128. Typically, the superimposed square-wave current has a longer period than sinusoidal current. Preferably, the period of the square-wave current is of the order of ten microseconds. The effect of the square-wave current is to alter the magnetic flux density in the SQUID chip. As shown in FIG. 7b, the magnetic flux density to be measured sets up a quiescent magnetic flux density 132 in the SQUID chip, and this results in quiescent amplitude 134 of the rf voltage.

If the quiescent flux density is such that the amplitude of the rf voltage is not at a maximum or minimum, as illustrated in FIG. 7b, the superimposed square wave flux oscillations 136 cause the amplitude of the rf voltage to oscillate between levels 138 and 140. A typical waveform of the resulting rf voltage is shown in FIG. 8a. Alternatively, when the quiescent flux density in the SQUID chip is such that the amplitude of the rf voltage is at a maximum or a minimum, as illustrated by flux density 143 in FIG. 7c, the amplitude of the resulting rf voltage is constant at level 145.

The rf voltage across the tuned circuit is amplified by amplifier 142, and its amplitude is detected by diode detector 144. The output of the diode detector consists substantially of the square-wave envelope of the signal at the input of amplifier 142, as shown in FIG. 8b. If the flux density is not at a minimum but, for example, is at level 132 as shown in FIG. 7b, the amplitude of the detected waveform is proportional to the difference between levels 140 and 138. Alternatively, if the quiescent flux level coincides with a maximum or a minimum in the triangular amplitude versus flux density characteristic, as illustrated by flux density 143 of FIG. 7c, the amplitude 145 of the detected waveform will be approximately zero.

If the quiescent flux density is in a region in which the characteristic has a positive slope, level 140 will be higher than level 138. In contrast, if the quiescent flux density is in a region in which the characteristic has a negative slope, level 140 will be lower than level 138. Thus, the phase of the detected waveform relative to the square-wave current depends on the slope of the voltage versus flux characteristic at the quiescent level.

Multiplier 146 multiplies the detected voltage out of detector 144 by a voltage from signal source 176 which is in phase with the square-wave current of source 130 (as indicated by the dotted phase control line in FIG. 6) to produce a product voltage which varies according to the quiescent flux level and the phase of the detected voltage. The product voltage is zero if the quiescent flux level coincides with a minimum or a maximum of the amplitude versus flux characteristic, is at a maximum positive level if the quiescent flux level is in the centre of a positively-sloped section of the amplitude versus flux characteristic, and is at a maximum negative level if the quiescent flux level is in the centre of a negatively-sloped section of the amplitude versus flux characteristic.

The product voltage is integrated by integrator 148, amplified by variable gain amplifier 150, and the resulting signal is used to energise feedback coil 114 via resistor 161, to subject SQUID chip 100 to a feedback magnetic flux density.

The effect Of the negative feedback is to apply a second magnetic flux density to the SQUID chip such that the total magnetic flux density is substantially constant. The output voltage 162 of integrator 148 is, therefore, indicative of the difference between the magnetic flux density to be measured and the substantially constant magnetic flux density. As shown in FIG. 7c, which illustrates the amplitude versus flux relationship in the flux-locked loop in equilibrium, the effect of the feedback is to drive the flux threading the SQUID to a constant value. A maximum rf amplitude corresponds to an unstable equillbrium point in the flux-locked loop, and deviation from this point will result in the loop converging to a minimum rf voltage.

A possible disadvantage of the use of separate feedback and rf coils is the need for separate cables (feedback and rf) connecting the SQUID probe to the flux-locked loop electronics. This could be quite significant for multi-SQUID systems. In the case of a three-axis magnetometer, for example, assuming no multiplexing is used, some 6 pairs of conductors are required, instead of three pairs if only a single coil is employed for each SQUID.

Figure 9:
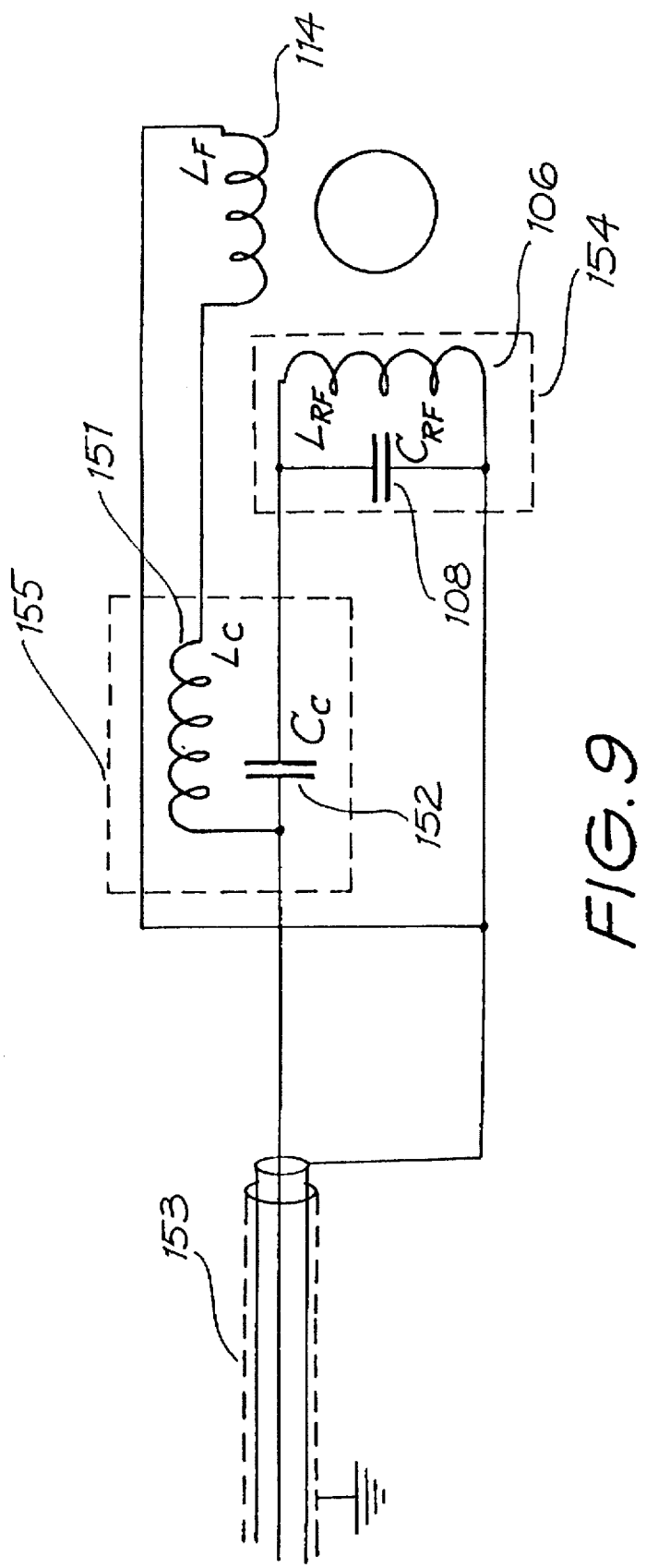
FIG. 9 is a schematic diagram showing the interconnection of an rf and feedback coil with a single tri-axial cable via a crossover network.

This problem may be addressed by means of a crossover network 155 as shown in FIG. 9 comprising an inductor ($L_C$) 151 and a capacitor ($C_C$)152. Both rf and low frequency signals are transmitted via a common tri-axial cable 153 in this embodiment, although a co-axial cable might also be used. Currents at rf frequencies are coupled to the SQUID via capacitor ($C_C$) 152, and the rf coil ($L_{RF}$) 106, while low frequency currents are coupled via inductance ($L_c$) 151 and the feedback coil ($L_f$) 114.

Figure 10:
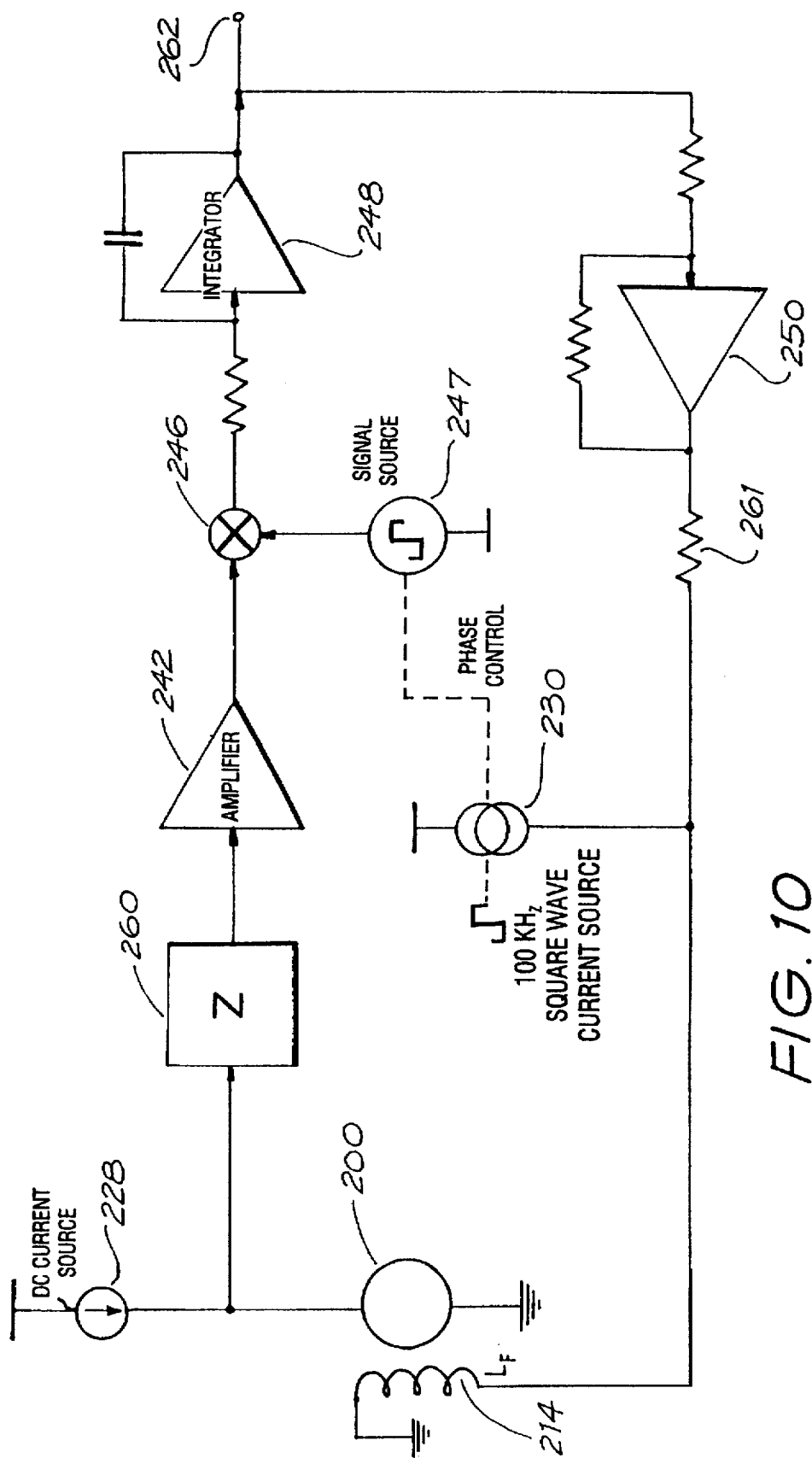
FIG. 10 is a schematic block diagram of a flux-locked loop for a dc SQUID magnetometer.

Referring to FIG. 10, a dc SQUID flux-locked loop (FLL) is illustrated. There are many variations and refinements possible but this is a typical basic circuit. Much of it is similar to the rf SQUID flux-locked loop described with reference to FIG. 6 and the operation can be explained with reference to FIGS. 7 and 8b (but excluding 8a).

The current source 228 provides dc current bias for the SQUID 200. When correctly biased, the SQUID output voltage is a periodic function of magnetic flux in the SQUID (FIG. 7a). A square wave (or possibly sinusoidal) current source 230, of typical frequency 100 kHz, provides flux modulation to the SQUID via coil 214. The SQUID output voltage (waveform 8b) is modulated at the same frequency as the flux with an amplitude and sign which depends on the quiescent magnetic flux in the SQUID. On a peak (FIG. 7c) the amplitude is zero. The SQUID output signal is usually passed through an impedance matching circuit 260 (eg. a transformer or tuned circuit) to optimise signal/noise ratio, then an amplifier 242 and demodulator (e.g. multiplier) 296 driven by a signal source 247 synchronous with the modulation of the current source 230. The output of the demodulator is a dc or slowly varying signal whose amplitude is proportional to the amplitude of the modulated signal from the SQUID. Negative output corresponds to a SQUID flux for which the slope of the voltage-flux characteristic (FIG. 7a) is negative, and conversely for positive output. The FLL is completed by signal conditioning circuits which may include an integrator 248 and amplifier 250 whose output produces a low-frequency current in the coil 214 via feedback resistor 261. The sense of the feedback is negative, ie., a positive applied flux produces a negative feedback flux, and vice versa, the net result being to lock the circuit onto a peak of the SQUID voltage-flux characteristic (FIG. 7c). The circuit output voltage 262 is proportional to the applied flux in the SQUID which is, in the case of a SQUID magnetometer, proportional to the applied magnetic field.

Conventionally in thin-film realisations of the dc SQUID the feedback coil is an integrated single-turn or multi-turn thin-film structure on the same substrate as the SQUID, for example in a separate lithographic layer overlaying the SQUID or in the same layer as the SQUID and surrounding it. Such coils produce magnetic flux distributions which are highly non-uniform over the area of the SQUID, and hence do not uniformly cancel an applied field at all points in the SQUID. In applications such as TEM in which the dynamic range and bandwidth are large this may result in hysteretic response from a high-Tc SQUID. The use of a non-integrated feedback coil of large dimensions compared with the SQUID overcomes this problem and in the preferred embodiment of a dc SQUID, a feedback coil 214 is provided having similar dimensions and properties to that described with reference to FIG. 1 of the drawings.

Figure 11:
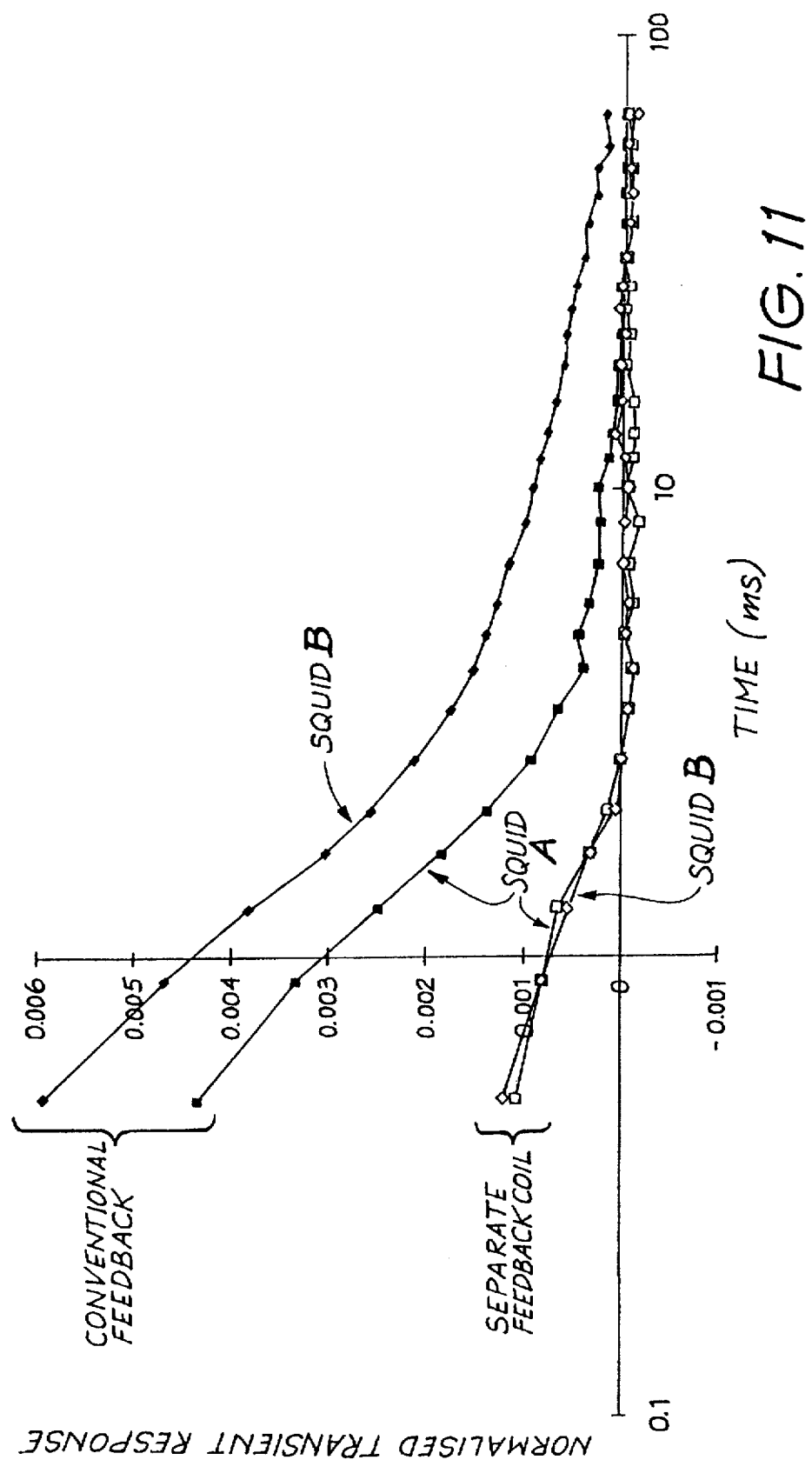
FIG. 11 graphically illustrates the transient response of SQUID magnetometers according to the invention by comparison with similar magnetometers which do not employ the separate feedback coil of the present invention.

Referring now to the graph shown in FIG. 11, this shows measured data illustrating the benefits of the separate feedback coil technique in the measurement of a fast, large amplitude transient such as is encountered in TEM geophysical prospecting.

The curves show the response of a high-Tc rf SQUID magnetometer to a rapidly-switched off magnetic field. The response is normalised to the amplitude of the field before switch-off, which occurs at time=0 seconds. Results are shown for two SQUIDs (A and B) and each device has been tested with feedback applied both via the rf coil in the conventional manner or via a separate large feedback coil in accordance with the present invention. In the case of feedback via the rf coil, both SQUIDs show a large transient response related to the magnetic hysteresis in the superconducting body of the SQUIDs. In SQUID B the transient is larger than in SQUID A reflecting lower quality superconducting material in SQUID B. However, when a separate feedback coil was used providing uniform cancellation of the applied field this transient was reduced to a similar low level for both SQUIDs. The residual transient is thought to be due to magnetic hysteresis in nearby materials other than the SQUIDs themselves.

Thus, there has been described high-$T_C$ SQUID magnetometers suitable for TEM mineral prospecting. Those skilled in the art will appreciate that numerous modifications can be made to the embodiment described without departing from the spirit or scope of the invention. The present invention can be used in more general applications where wide-dynamic range SQUID systems may be useful. Examples of such applications include other types of electromagnetic prospecting systems, nuclear magnetic resonance detectors, and non-destructive testing applications. The embodiment described should, therefore, be regarded as illustrative of the principle of the invention, but not restrictive.

We claim:

1. A high critical temperature (high-$T_C$), superconducting quantum interference device (SQUID) magnetometer for measuring a subject magnetic field in which the SQUID magnetometer is positioned, the magnetometer including:

a SQUID chip having a non-super conducting region threaded by a first magnetic flux produced by the subject magnetic field and energized by an excitation circuit, a separate feedback coil positioned adjacent to the SQUID chip, and a flux-locked loop for producing a feedback signal to energize the feedback coil, the flux-locked loop driving the feedback coil to produce a feedback magnetic flux which adds to, or subtracts from, the first magnetic flux to produce a resultant total magnetic flux threading the SQUID chip, and the feedback coil having a size relative to the SQUID chip to cause the resultant total magnetic flux to be substantially uniform over the SQUID chip, the feedback signal thereby being indicative of the magnitude of the first magnetic flux and the subject magnetic field which produces it.

2. The magnetometer of claim 1 wherein the feedback coil includes a cylindrical coil mounted co-axially with and in close proximity to the SQUID chip.

3. The magnetometer of claim 2 wherein the diameter of the cylindrical coil is greater than the maximum dimension of the SQUID chip.

4. The magnetometer of claim 1 wherein:

the SQUID has a single weak link and is configured as a radio frequency SQUID, and the excitation circuit comprises a tuned circuit including a radio frequency coil.

5. The magnetometer of claim 4 wherein the SQUID chip is formed as a thin film of ceramic superconducting material on a suitable substrate.

6. The magnetometer of claim 5 wherein the superconducting material is $YBa_2Cu_3O_7$.

7. The magnetometer of claim 5 wherein the weak link includes a step in the substrate to cause a misalignment of crystals of the superconducting material in the region of the step.

8. The magnetometer of claim 5 wherein the weak link is a junction selected from a group comprising: a step edge junction, a grain boundary junction, a bicrystal junction, a step-SNS junction, a multi-layer junction and a ramp junction.

9. The magnetometer of claim 4 wherein the rf coil is mounted in close proximity to the chip.

10. The magnetometer of claim 9 wherein the rf coil is a spiral coil mounted co-axially with and parallel to the SQUID chip.

11. The magnetometer of claim 9 wherein the rf circuit is driven by a radio frequency constant current source.

12. The magnetometer of claim 11 wherein the radio frequency current source has a frequency of at least 1 MHz.

13. The magnetometer of claim 12 wherein the radio frequency current source has a frequency in the range of from 150 MHz to 200 MHz.

14. The magnetometer of claim 4 including a single interconnecting cable and a crossover network for connecting the rf coil and the feedback coil to the flux-locked loop.

15. The magnetometer of claim 14 wherein the cross-over network comprises an LC network, the rf coil and feedback coil being connected in parallel with one another, an inductor of the LC network being connected in series with the feedback coil and a capacitor of the LC network being connected in series with the rf coil.

16. The magnetometer of claim 1 wherein:

the SQUID has two weak links and is configured as a dc SQUID, and the excitation circuit comprises a dc constant current source.

17. The magnetometer of claim 16 wherein the SQUID chip is formed as a thin film of ceramic superconducting material on a suitable substrate.

18. The magnetometer of claim 17 wherein the superconducting material is $YBa_2Cu_3O_7$.

19. The magnetometer of claim 17 wherein the weak links include two steps in the substrate to cause a misalignment of crystals of the superconducting material in the region of the steps.

20. The magnetometer of claim 17 wherein the weak links include a single step extending across the substrate and the superconducting material is located on the substrate such that two regions of the superconducting material, corresponding to the locations of two weak links, pass over the step to cause a misalignment of crystals of the superconducting material in each of those regions.

21. The magnetometer of claim 17 wherein each of the weak links is a junction selected from a group comprising: a step edge junction, a grain boundary junction, a bicrystal junction, a step-SNS junction, a multi-layer junction and a ramp junction.

22. The magnetometer as claimed in claim 1 wherein a probe containing the SQUID chip and coils magnetically coupled to the chip are shielded by a thin-walled, non-magnetic stainless steel shield.

23. The magnetometer of claim 22 wherein the shield includes a housing containing the SQUID chip and the coupled coils, the housing having a wall thickness of 0.1 mm to 0.5 mm.

24. The magnetometer of claim 22 wherein the wall thickness is 0.3 mm.

25. The magnetometer as in claim 22 wherein cables connected to said coupled coils are shielded in respectively associated thin-walled, non-magnetic stainless steel tubes.

26. The magnetometer of claim 25 wherein the wall thickness of the tube is in the range of 0.1 mm to 0.5 mm.

27. The magnetometer of claim 25 wherein the wall thickness of the tube is 0.3 mm.

28. A high critical temperature (high-$T_c$) radio frequency superconducting quantum interference device rf (SQUID) magnetometer for measuring a subject magnetic field in which the SQUID magnetometer is positioned, the magnetometer including:

a SQUID chip having a single weak link and a non-superconducting region threaded by a first magnetic flux produced by the subject magnetic field and energized by a radio frequency excitation circuit having a radio frequency tuned circuit including a radio frequency coil, a separate feedback coil positioned adjacent to the SQUID chip, a flux-locked loop for producing a feedback signal to energize the feedback coil, and a single interconnecting cable and a cross over network for connecting the rf coil and the feedback coil to the flux-locked loop, the flux-locked loop driving the feedback coil to produce a feedback magnetic flux which adds to, or subtracts from, the first magnetic flux to produce a resultant total magnetic flux threading the SQUID chip, the feedback coil having a size relative to the SQUID chip to cause the resultant total magnetic flux to be substantially uniform over the SQUID chip, the feedback signal thereby being indicative of the magnitude of the first magnetic flux and the subject magnetic field which produces it.

29. The magnetometer of claim 28 wherein the feedback coil includes a cylindrical coil mounted co-axially with and in close proximity to the SQUID chip.

30. The magnetometer of claim 29 wherein the diameter of the cylindrical coil is greater than the maximum dimension of the SQUID chip.

31. The magnetometer of claim 28 wherein the SQUID chip is formed a as thin film of ceramic superconducting material on a suitable substrate.

32. The magnetometer of claim 31 wherein the superconducting material is $YBa_2Cu_3O_7$.

33. The magnetometer of claim 31 wherein the weak link includes a step in the substrate to cause a misalignment of crystals of the superconducting material in the region of the step.

34. The magnetometer of claim 31 wherein the weak link is a junction selected from a group comprising: a grain boundary junction, a bicrystal junction, a step-SNS junction, a multi-layer junction and a ramp junction.

35. The magnetometer of claim 28 wherein the rf coil is mounted in close proximity to the chip.

36. The magnetometer of claim 35 wherein the rf coil is a spiral coil mounted co-axially with and parallel to the SQUID chip.

37. The magnetometer of claim 35 wherein the rf circuit is driven by a radio frequency constant current source.

38. The magnetometer of claim 37 wherein the radio frequency current source has a frequency of at least 1 Mhz.

39. The magnetometer of claim 37 wherein the radio frequency current source has a frequency in the range of from 150 MHZ to 200 MHZ.

40. The magnetometer of claim 28 wherein the cross-over network comprises an LC network, the rf coil and feedback coil being connected in parallel with one another, an inductor of the LC network being connected in series with the feedback coil and a capacitor of the LC network being connected in series with the rf coil.

41. A high-$T_C$ SQUID magnetometer for TEM comprising:

a SQUID chip having an RF excitation field coil disposed thereon; and a feedback electromagnetic coil dimensioned and disposed to provide a substantially uniform magnetic flux over the entire SQUID chip when electrical current is passed through the feedback coil.

42. A magnetometer as in claim 41 wherein said feedback coil includes a solenoidal coil mounted co-axially and in close proximity with said SQUID chip.

43. A magnetometer as in claim 42 wherein the feedback coil has a diameter that is greater than the maximum dimension of said SQUID chip.

* * * * *

UNITED STATES PATENT AND TRADEMARK OFFICE
CERTIFICATE OF CORRECTION

PATENT NO. : 5,635,834
DATED : June 3, 1997
INVENTOR(S) : SLOGGETT et al

It is certified that error appears in the above-identified patent and that said letters patent is hereby corrected as shown below:

Column 1, line 48, "of" should read --or--.
Column 1, line 65, "hysteretie" should read --hysteretic--.
Column 2, line 1, "various" should be capitalized.
Column 4, line 16, "QE" should read --of--.
Column 4, line 27, insert a space after "by".
Column 5, line 15, "minimiss" should read --minimise--.
Column 6, line 15, after "than" insert --the--.
Column 7, line 6, "Of" should read --of--.
Claim 1, line 5, "non-super conducting" should read --non-super-conducting--.

Signed and Sealed this

Twenty-third Day of September, 1997

*Attest:*

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,635,834
DATED : June 3, 1997
INVENTOR(S) : SLOGGETT et al

It is certified that error appears in the above-identified patent and that said letters patent is hereby corrected as shown below:

Column 1, line 48, "of" should read --or--.
Column 1, line 65, "hysteretie" should read --hysteretic--.
Column 2, line 1, "various" should be capitalized.
Column 4, line 16, "QE" should read --of--.
Column 4, line 27, insert a space after "by".
Column 5, line 15, "minimiss" should read --minimise--.
Column 6, line 15, after "than" insert --the--.
Column 7, line 6, "Of" should read --of--.
Claim 1, line 5, "non-super conducting" should read --non-superconducting--.

This certificate supersedes Certificate of Correction issued September 23, 1997.

Signed and Sealed this

Seventeenth Day of February, 1998

Attest:

BRUCE LEHMAN

*Attesting Officer*  *Commissioner of Patents and Trademarks*